United States Patent
Wang et al.

(10) Patent No.: US 10,103,194 B2
(45) Date of Patent: Oct. 16, 2018

(54) SELF-ALIGNED OPTICAL GRID ON IMAGE SENSOR

(71) Applicant: OmniVision Technologies, Inc., Santa Clara, CA (US)

(72) Inventors: Xin Wang, San Jose, CA (US); Dajiang Yang, San Jose, CA (US); Qin Wang, San Jose, CA (US); Duli Mao, Sunnyvale, CA (US); Dyson Hsin-Chih Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 26 days.

(21) Appl. No.: 15/276,000

(22) Filed: Sep. 26, 2016

(65) Prior Publication Data

US 2018/0090538 A1  Mar. 29, 2018

(51) Int. Cl.
H01L 27/146 (2006.01)

(52) U.S. Cl.
CPC .. H01L 27/14685 (2013.01); H01L 27/14621 (2013.01); H01L 27/14629 (2013.01)

(58) Field of Classification Search
CPC ............ H01L 27/14685; H01L 31/18–31/208
See application file for complete search history.

(56) References Cited

U.S. PATENT DOCUMENTS

| | | | | |
|---|---|---|---|---|
| 5,708,264 A * | 1/1998 | Hawkins | ........... | H01L 27/14685 250/208.1 |
| 5,889,277 A * | 3/1999 | Hawkins | ........... | H01L 27/14868 250/208.1 |
| 8,269,264 B2 * | 9/2012 | Nozaki | ............. | H01L 27/14621 257/291 |
| 8,507,964 B2 | 8/2013 | Nozaki et al. | | |
| 8,610,229 B2 | 12/2013 | Hsu et al. | | |
| 9,711,560 B2 * | 7/2017 | Tsai | ................... | H01L 27/14621 |
| 9,780,134 B2 * | 10/2017 | Hashimoto | ....... | H01L 27/14629 |

(Continued)

OTHER PUBLICATIONS

Roquiny et al.; "Colour Control of Titanium Nitride Coatings Produced by Reactive Magnetron Sputtering at Temperature Less Than 100° C."; Surface and Coatings Technology, 116-119 (Sep. 1999); Laboratorie d' Analyses par Reactions Nucleaires, Facultés Universitaires Notre-Dame de la Paris, rue de Bruxelles 61, B-5000 Namur, Belgium; pp. 278-283.

*Primary Examiner* — Asok K Sarkar
*Assistant Examiner* — Grant Withers
(74) *Attorney, Agent, or Firm* — Larry E. Henneman, Jr.; Henneman & Associates, PLC

(57) ABSTRACT

An image sensor includes a substrate, a plurality of light sensitive pixels, a first plurality of color filters, a plurality of reflective sidewalls, and a second plurality of color filters. The light sensitive pixels are formed on said substrate. The first plurality of color filters is disposed over a first group of the light sensitive pixels. The reflective sidewalls are formed on each side of each of the first plurality of color filters. The second plurality of color filters are disposed over a second group of light sensitive pixels and each color filter of the second plurality of color filters is separated from each adjacent filter of said first plurality of color filters by one of the reflective sidewalls. In a particular embodiment an etch-resistant layer is disposed over the first plurality of color filters and the second group of light sensitive pixels.

14 Claims, 9 Drawing Sheets

(56) References Cited

U.S. PATENT DOCUMENTS

| | | | |
|---|---|---|---|
| 2007/0051992 A1* | 3/2007 | Jung | H01L 27/14625 257/294 |
| 2007/0096232 A1* | 5/2007 | Hwang | H01L 27/14623 257/431 |
| 2007/0238034 A1* | 10/2007 | Holscher, Jr. | H01L 27/14621 430/7 |
| 2012/0019695 A1* | 1/2012 | Qian | H01L 27/14621 348/273 |
| 2012/0075509 A1* | 3/2012 | Ito | H01L 27/14621 348/265 |
| 2012/0261781 A1 | 10/2012 | Hsu et al. | |
| 2012/0320242 A1* | 12/2012 | Ogita | H01L 27/14621 348/276 |
| 2015/0115382 A1* | 4/2015 | Wu | H01L 27/14627 257/432 |
| 2015/0130007 A1* | 5/2015 | Kawamura | H01L 27/14623 257/432 |
| 2016/0047690 A1* | 2/2016 | Yun | G01J 1/0492 250/206 |
| 2016/0099266 A1* | 4/2016 | Zheng | H01L 27/1463 250/208.1 |
| 2016/0148970 A1* | 5/2016 | Cheng | H01L 27/14645 257/292 |
| 2016/0276396 A1* | 9/2016 | Tayanaka | H01L 27/14623 |
| 2016/0352983 A1* | 12/2016 | Boettiger | H01L 27/14603 |
| 2017/0154907 A1* | 6/2017 | Ogita | H01L 27/1462 |

\* cited by examiner

SELF-ALIGNED OPTICAL GRID ON IMAGE SENSOR

BACKGROUND OF THE INVENTION

Field of the Invention

This invention relates generally to color image sensors. More particularly, it relates to image sensors having a light filter array with an optical grid for minimizing pixel crosstalk.

Description of the Background Art

Image sensors that are able to capture colored images are well known in the prior art. Such image sensors include a plurality of light sensitive regions (e.g. photodiodes) and a plurality of variously colored light filters. Each pixel includes a light filter of a single color disposed over the photodiode, which is connected to readout circuitry for determining the amount of light (within the spectrum corresponding to the color of the light filter) that impinges on the pixel during a shutter period. The pixels are typically arranged in rows and columns, with a red pixel (i.e. one having a color filter adapted to pass red light), a blue pixel, and two green pixels making up each 2×2 square of pixels (i.e. a Bayer filter pattern). By measuring how much light of each color impinges on a specific region of the image sensor, colored images can be captured. The quality of the images depends on how accurately the light of each color is measured by the light sensitive regions.

Crosstalk between pixels (e.g., light filtered by one pixel but measured by another, differently colored pixel) diminishes the accuracy of measurement and causes undesirable distortions in the colors of the captured images. To prevent crosstalk, U.S. Patent Publication 2007/0238034 (Holscher, Jr.) discloses a method of forming an opaque spacer between adjacent color filters, which blocks or reflects light that would otherwise travel through the color filter of one pixel and onto the light sensitive region of another. The opaque spacer significantly decreases crosstalk between adjacent pixels, but is approximately 50 nm thick and, therefore, reduces the quantum efficiency (QE) of each pixel.

U.S. Patent Publication 2012/0019695 (Qian et al.) discloses a color filter sidewall for preventing crosstalk between adjacent pixels. However, the sidewall of Qian et al. also reduces QE, because the sidewall is dark and absorbs incident light. Because some of the light incident on each pixel is absorbed, the sensitivity of the pixels is diminished, making the image sensor less effective for certain applications.

U.S. Pat. No. 8,610,229 (Hsu et al.) discloses a reflective shielding feature comprising metal layers and a dielectric layer. However, the reflective shielding of Hsu et al. must be aligned separately from the color filters, requiring extra processes and increasing the cost to manufacture.

U.S. Pat. No. 8,269,264 (Nozaki et al.) discloses a waveguide with/without a metal section disposed between adjacent color filters. The waveguide has an index of refraction that is smaller than the indices of refraction of the color filters, which causes stray light to bend back toward the photosensitive area of the pixel. However, the image sensor disclosed by Nozaki et al. utilizes the effect of total internal reflection, which occurs for light incident at specific angles. For light incident at other angles, the QE of the image sensor of Nozaki et al. is diminished, making it unsuitable for some applications.

Although several image sensors have been proposed to decrease the amount of crosstalk between adjacent pixels of different colors, each image sensor suffers from a reduction in QE or a significant increase in time and/or cost of production. What is needed, therefore, is a colored image sensor that minimizes crosstalk between adjacent, differently colored pixels and maximizes QE, while minimizing production time and/or cost.

SUMMARY

The present invention overcomes the problems associated with the prior art by providing an image capture device with reflective walls disposed between adjacent color filters. A method of forming the reflective sidewalls, while eliminating at least one photomasking step is also disclosed. Features of the invention provide improved light efficiency, reduced inter-color crosstalk, and a simpler, self-aligning manufacturing process.

An example method of manufacturing an image sensor includes providing a substrate including a plurality of light sensitive pixels, forming a first plurality of color filters over a first group of the plurality of light sensitive pixels; and forming reflective side walls on side surfaces of the color filters of the first plurality of color filters. The example method further includes forming a second plurality of color filters over a second group of the plurality of light sensitive pixels, such that each filter of the second plurality of color filters is separated from each adjacent filter of the first plurality of color filters by one of the reflective sidewalls.

In a particular example method, the step of forming the reflective sidewalls includes forming an etch-resistant layer over the first plurality of color filters and in gaps therebetween and forming a reflective layer over the etch-resistant layer. The particular example method additionally includes etching the reflective layer to remove the reflective layer from above the first plurality of color filters and from bottoms of the gaps, leaving a portion of the reflective layer (the reflective side-walls) on the side surfaces of the color filters of the first plurality of color filters. In the example embodiment, the etch-resistant layer that is less than 12 nm thick and greater than 8 nm thick. The reflective layer is less than 150 nm thick and greater than 50 nm thick.

In various embodiments, the etch-resistant layer and/or the reflective layer can be formed from different materials. For example, in one method, the etch-resistant layer includes a dielectric material and the reflective layer includes a metal layer. More particularly, the metal layer includes tin nitride, and the dielectric material includes silicon dioxide. In another particular method, the metal layer includes tungsten, and the dielectric material includes silicon dioxide. In yet another particular embodiment, the metal layer includes aluminum, and the dielectric material includes silicon dioxide.

Example processes for forming the etch-resistant layer are also disclosed. For example, in one method, the step of forming an etch-resistant layer over the first plurality of color filters and in the gaps includes forming the etch-resistant layer at a temperature cooler than 225 degrees Celsius. In one particular example method, the step of forming the etch-resistant layer at a temperature cooler than 225 degrees Celsius includes forming the etch-resistant layer using a chemical vapor deposition process (low temperature CVD). Alternatively, the step of forming the etch-resistant layer at a temperature cooler than 225 degrees Celsius includes forming the etch-resistant layer using a physical vapor deposition process (low temperature PVD).

Due to the positioning of the first plurality of color filters, three or more differently colored filters can be formed on the image sensor. In an example method, the step of forming a first plurality of color filters over the first group of the light sensitive pixels includes forming the first plurality of color filters from a material operative to pass light of a first predetermined color band. The step of forming the second plurality of color filters includes forming the second plurality of color filters from a material operative to pass light of a second predetermined color band different from the first predetermined color band. The example method additionally includes forming a third plurality of color filters over a third group of the plurality of light sensitive pixels, such that each filter of the third plurality of color filters is separated from each adjacent filter of the first plurality of color filters by one of the reflective sidewalls. The step of forming the third plurality of color filters includes forming the third plurality of color filters from a material operative to pass light of a third predetermined color band different from the first predetermined color band and the second predetermined color band.

In the example methods, the step of forming reflective sidewalls on the side surfaces of the color filters of the first plurality of color filters includes forming the reflective sidewalls to extend at least as high as a top surface of one of the color filters of the first plurality of color filters. The height of the reflective sidewalls increases the optical sensitivity and decreases cross talk between adjacent light sensitive pixels in the image sensor.

An example image sensor includes a substrate, a plurality of light sensitive pixels formed in the substrate, a first plurality of color filters, a plurality of reflective sidewalls, and a second plurality of reflective sidewalls. The color filters of the first plurality of color filters are disposed over a first group of the plurality of light sensitive pixels. The reflective sidewalls are each disposed on a side surface of the color filters of the first plurality of color filters. Color filters of the second plurality of color filters are disposed over a second group of the plurality of light sensitive pixels, between adjacent filters of the first plurality of color filters. Each color filter of the second plurality of color filters is separated from each adjacent color filter of the first plurality of color filters by one of the reflective sidewalls.

The example image sensor further includes an etch-resistant layer disposed over top surfaces of the color filters of the first plurality of color filters, between the reflective sidewalls and the side surfaces of the color filters of the first plurality of color filters, and over a surface of the substrate in gaps between adjacent ones of the color filters of the first plurality of color filters. The transparent etch-resistant layer is less than 12 nm thick and greater than 8 nm thick, and the reflective layer is less than 150 nm thick and greater than 50 nm thick. In a particular example embodiment, the reflective layer includes a metal layer, and the etch-resistant layer includes a dielectric material. For example, in one embodiment, the metal layer includes tin nitride, and the dielectric material is silicon dioxide. In another example embodiment, the metal layer includes tungsten, and the dielectric material is silicon dioxide. In yet another example embodiment, the metal layer includes aluminum, and the dielectric material is silicon dioxide.

In an example image sensor, each color filter of the first plurality of color filters is operative to pass light of a first predetermined color band (e.g., green), and each filter of the second plurality of color filters is operative to pass light of a second predetermined color band (e.g., red) different from the first predetermined color band. The example image sensor further includes a third plurality of color filters. The color filters of the third plurality of color filters are disposed over a third group of the plurality of light sensitive pixels, between adjacent filters of the first plurality of color filters. Each color filter of the third plurality of color filters is separated from each adjacent color filter of the first plurality of color filters by one of the plurality of reflective sidewalls. Each filter of the third plurality of color filters is operative to pass light of a third predetermined color band (e.g., blue) different from the first predetermined color band and the second predetermined color band.

In the example embodiments, each of the plurality of reflective sidewalls extends at least as high as a top surface of a filter of the first plurality of color filters. In addition, because the side surface of the color filters of the second plurality of color filters are not disposed adjacent the side surfaces of the color filters of the third plurality of color filters, a single deposition of reflective sidewalls on the side surfaces of the color filters of the first plurality of color filters is sufficient to separate each color filter of the display from all adjacent color filters of the display with a reflective sidewall.

BRIEF DESCRIPTION OF THE DRAWINGS

The present invention is described with reference to the following drawings, wherein like reference numbers denote substantially similar elements.

DETAILED DESCRIPTION

The present invention overcomes the problems associated with the prior art, by providing an image sensor including a reflective sidewall between adjacent color filters and methods of producing the same. In the following description, numerous specific details are set forth (e.g., layout of color filters, semiconductor fab processes, etc.) in order to provide a thorough understanding of the invention. Those skilled in the art will recognize, however, that the invention may be practiced apart from these specific details. In other instances, details of well-known image sensor production practices (e.g., etching, doping, chemical/physical vapor deposition, routine optimization, etc.) and components have been omitted, so as not to unnecessarily obscure the present invention.

Figure 1:
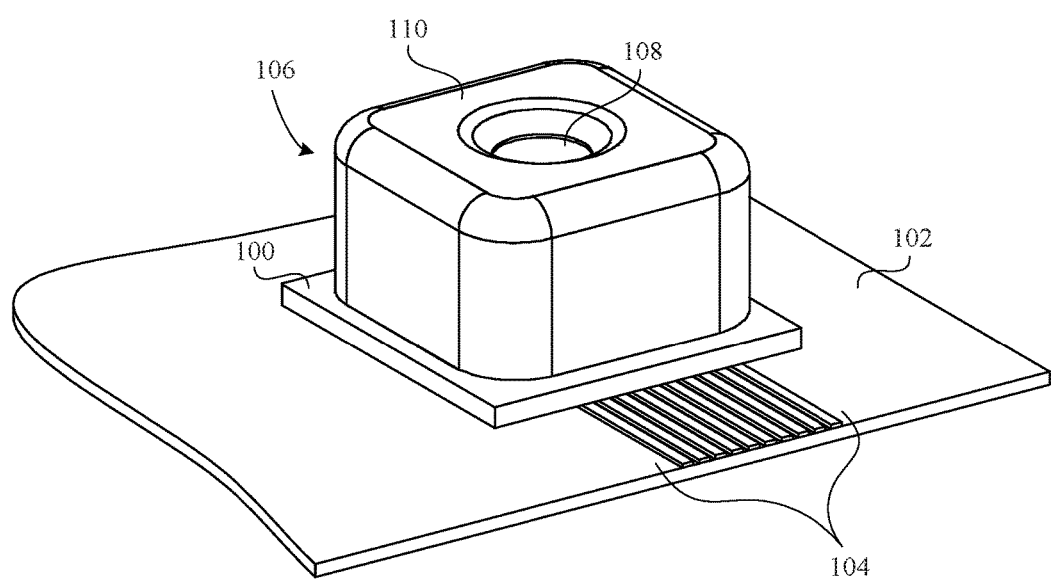
FIG. 1 is a perspective view of an example camera module.

FIG. 1 is a perspective view of an image sensor 100 mounted on a portion of a printed circuit board (PCB) 102 that represents a PCB of a camera hosting device (e.g., automobile, manufacturing machine, medical device, cell phone, etc.). Image sensor 100 communicates electronically with other components of the hosting device via a plurality of conductive traces 104. In the example embodiment, image sensor 100 is depicted as being part of a camera module 106 that further includes an optical assembly 108 and a housing 110. As shown, housing 110 is mounted to image sensor 100 and optical assembly 108 is disposed therebetween. Those skilled in the art will recognize that the particular designs and/or presence of PCB 102, traces 104, optical assembly 108, and/or housing 110 will depend on the particular application, and are not particularly relevant to the present invention. Therefore, PCB 102, traces 104, optical assembly 108, and housing 110 are representational in character only.

Figure 2A:
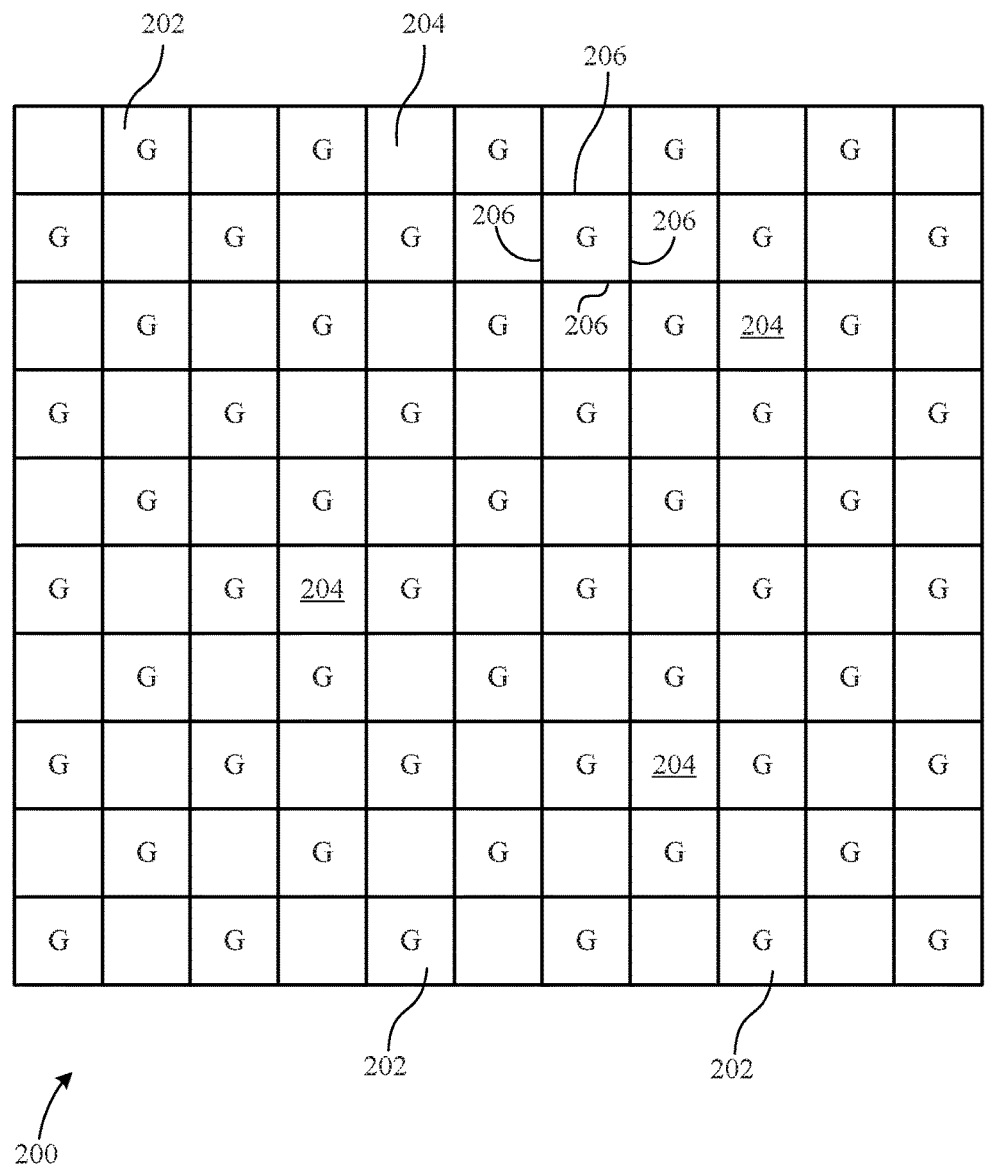
FIGS. 2A-2C are top views of a representative portion of an example image sensor of FIG. 1 in various states of production.

FIG. 2A is a top view of a representative portion 200 of image sensor 100, in an intermediate state of production. A plurality of green (G) color filters 202 are formed on image sensor 100 over an array of photosensitive pixels (not shown). Green color filters 202 are formed in a checkerboard pattern, defining a plurality of gaps 204 therebetween. Only some of the green color filters 202 and gaps 204 are labeled with numeric indices, so as not unnecessarily obscure the drawing. However, all of the green color filters are labeled with the letter "G", and all of the gaps are left blank. Green color filters 202 can be formed by any of various processes known in the art, such as, but not limited to, spin-coating image sensor 100 with green color filter material, patterning a photoresist layer over certain portions of the green color filter material, and etching the green color filter material to remove portions that are not protected by the photoresist layer.

Reflective sidewalls 206 are formed on each side of each green color filter 202, by a process that will be described in greater detail with reference to FIGS. 4A-4F. Reflective sidewalls 206 of only one example green color filter 202 are labeled, to avoid needlessly complicating the drawing, but a reflective sidewall 206 is formed on each side of each green color filter 202 adjacent a gap 204.

Figure 2B:
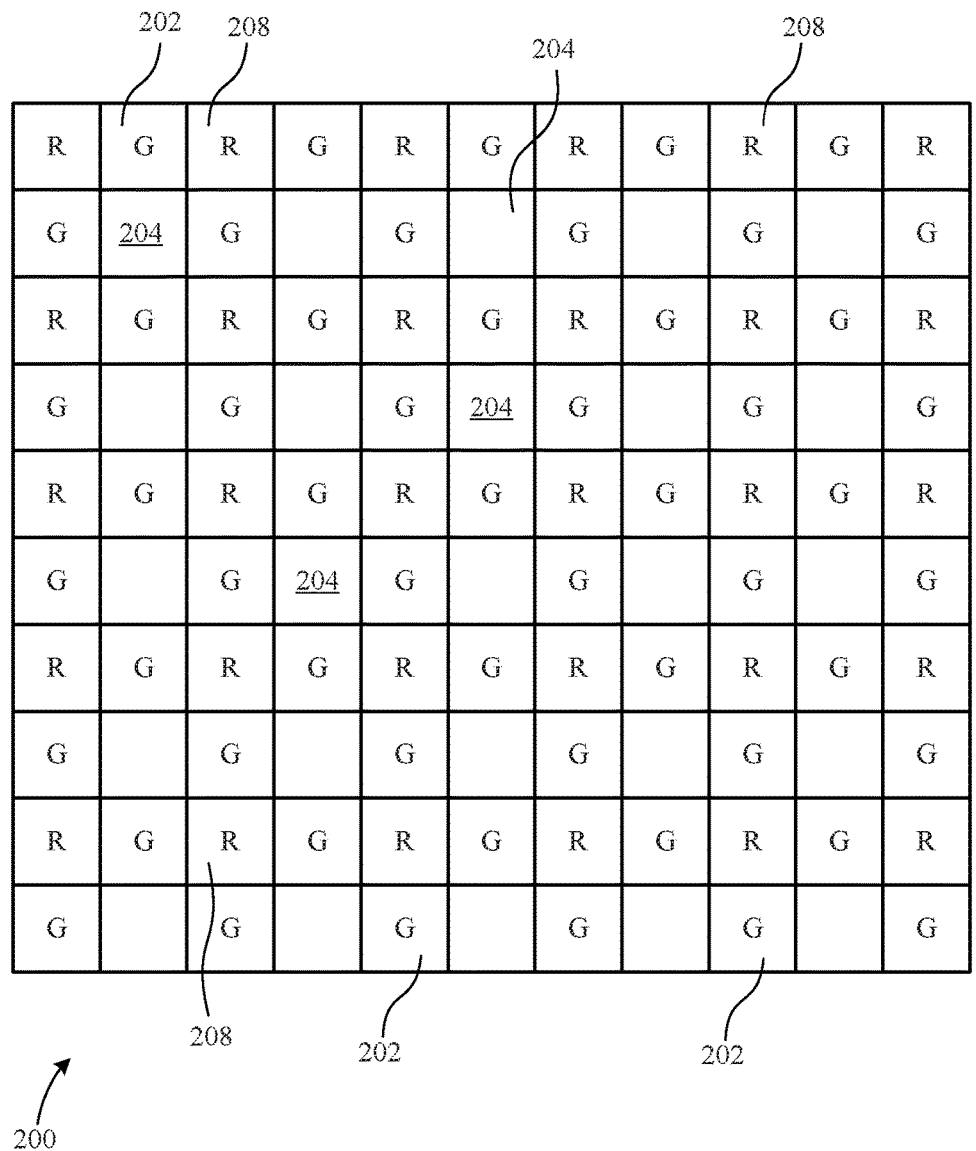

FIG. 2B shows image sensor portion 200 after a plurality of red color filters 208 have been formed in half of gaps 204. Red color filters 208 are formed using substantially similar processes to those used to form green color filters 202, but with a material having the appropriate color sensitivity for a red filter.

Figure 2C:
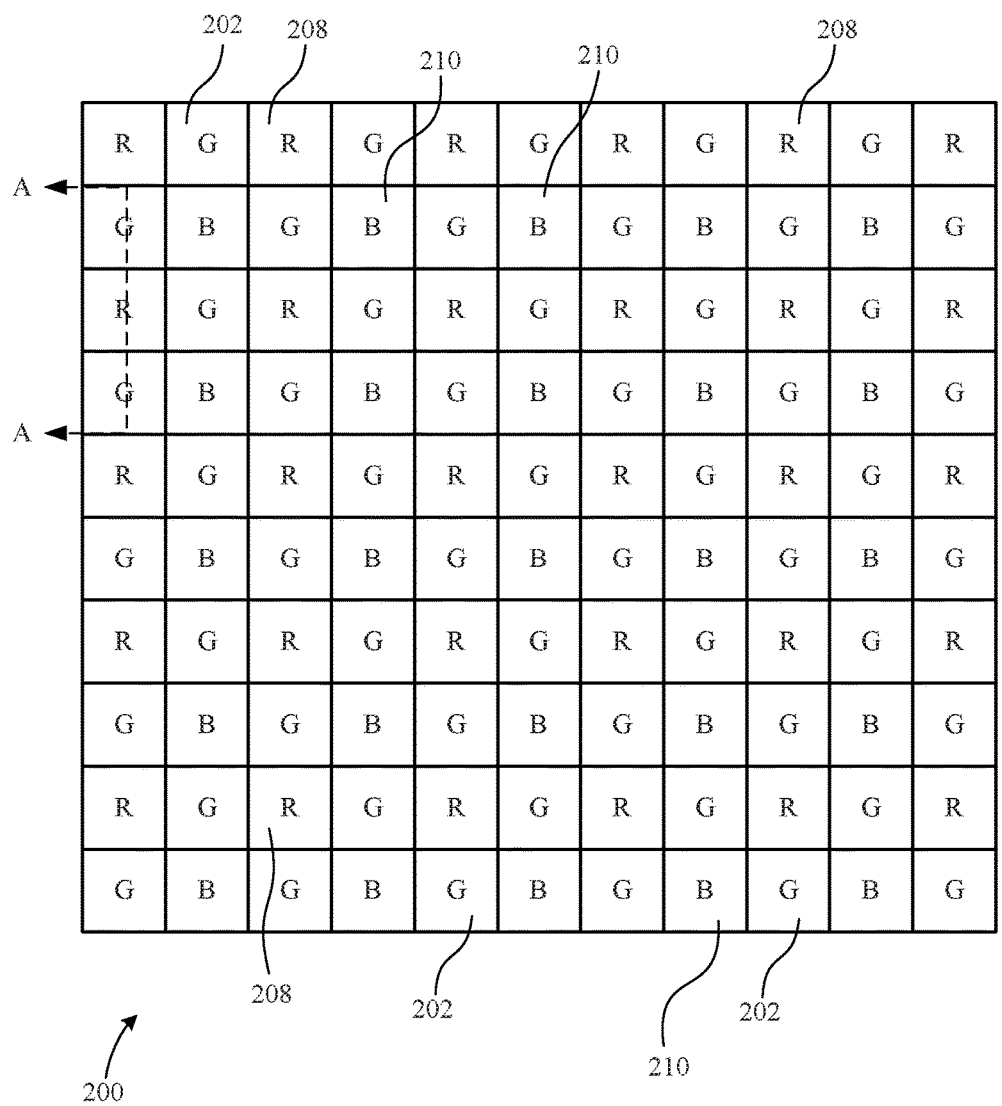

FIG. 2C shows image sensor portion 200 after a plurality of blue color filters 210 have been formed in the remainder of gaps 204. Blue color filters 210 are formed using processes substantially similar to those used to form green color filters 202 and red color filters 208, but with a material having the appropriate color sensitivity for a blue filter.

FIGS. 2A-2C are intended to simply illustrate the arrangement of color filters 202, 208, and 210 and reflective walls 206. The formation of color filters described with reference to FIGS. 2A-2C need not be performed in the sequence described. For example, green color filters 200 can be formed after red and blue color filters 204 and 206. Additionally, the layout of color filters 200, 204, and 206 on image sensor 100 is representative in nature. The present invention can be utilized with varying layouts, differently shaped pixels/color filters, and/or with differently colored filters. The particular details provided are by way of example and not limiting with respect to the scope of the invention.

Figure 3:
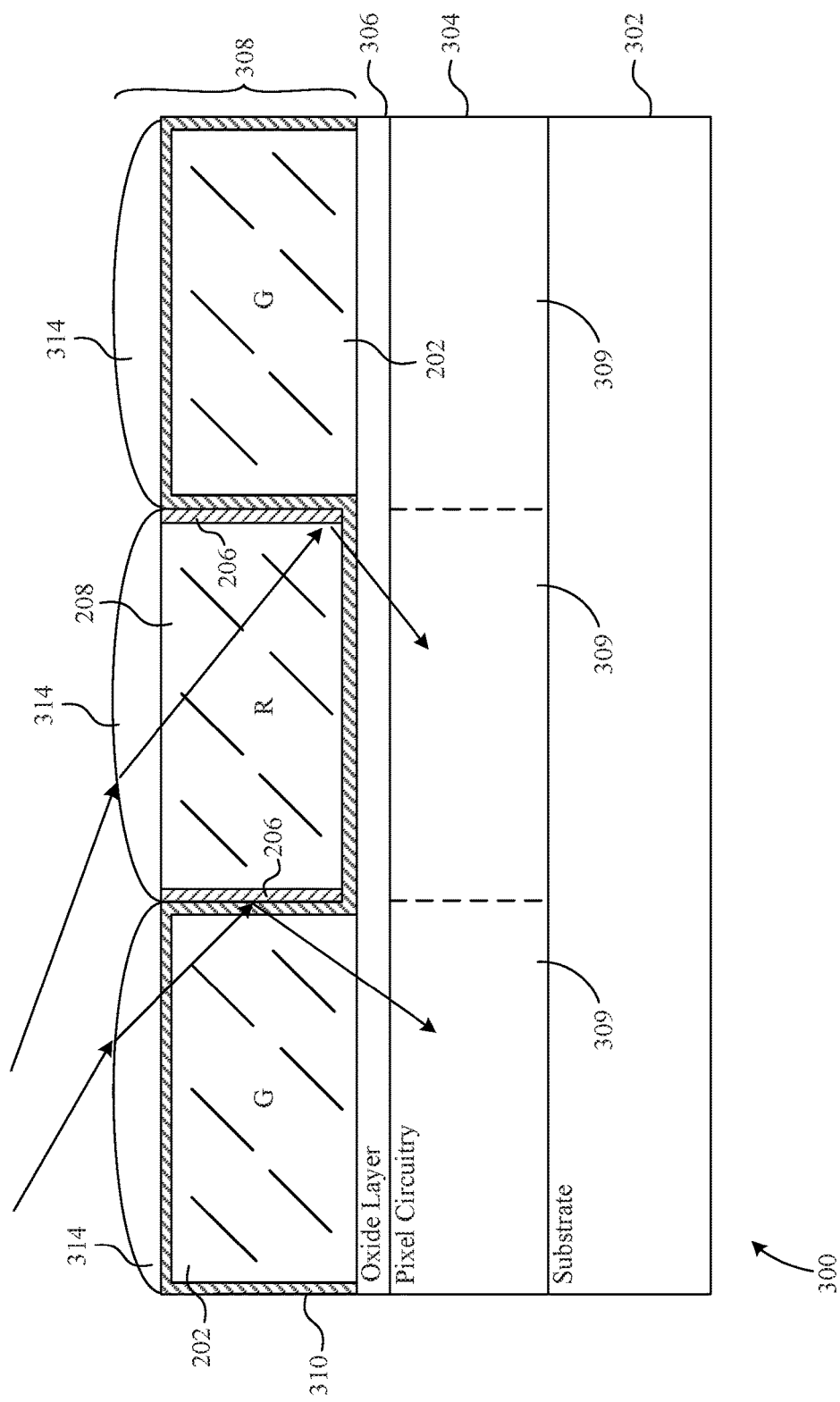
FIG. 3 is cross-sectional view of a portion the image sensor of FIG. 1, taken along line A-A of FIG. 2C.

FIG. 3 is a sectional view of an even smaller portion 300 of image sensor 100 taken along line A-A of FIG. 2C. Portion 300 includes a portion of a substrate 302, a portion of pixel circuitry 304, an oxide layer 306, and pixel optics 308. In the example embodiment, substrate 302 is a p-doped silicon wafer, formed by diffusing any of a number of charge donor atoms into a silicon crystal or other applicable crystal lattice. Pixel circuitry 304 includes photodiodes, transistors, diffusion regions, metallization layers, and any other necessary electronics that have been formed onto substrate 302, to create a photosensitive array of image sensor 100. Oxide layer 306 is a passivation layer that prevents decay of pixel circuitry 304 and protects pixel circuitry 304 from damage during the formation of pixel optics 308. In the example embodiment, oxide layer 306 is a silicon dioxide layer, but can be formed from any other suitable material.

Pixel optics 308 impart color sensitivity to image sensor 100, decrease pixel cross-talk, and increase the quantum efficiency (QE) of the individual pixels 309 that make up image sensor 100. Pixel optics 308 (shown in FIG. 3) include green color filters 202, a red color filter 208, an etch-resistant layer 310, reflective sidewalls 206, and micro-lenses 314. Green color filters 202 filter incident light and pass only light corresponding to the green range of the visible light spectrum. Red color filter 204 passes only light corresponding to the red range of the visible light spectrum. Utilizing differently colored filters allows image sensor 100 to produce full-color images by blending the registered light intensity values detected by the pixels disposed beneath each set of four color filters (1 Red, 1 Blue, and 2 Green) during any given shutter period.

Etch-resistant layer 310 allows for the self-alignment of reflective sidewalls 206, and prevents damage to green color filters 202 during the manufacturing process. Etch-resistant layer 310 is a layer of silicon dioxide formed before the formation of red color filters 208 and blue color filters 221 (FIG. 2C). Etch-resistant layer 310 is approximately 10 nanometers (nm) thick (thickness can vary between 8 nm and 12 nm), which is thin enough to transmit visible light. Because reflective sidewalls 206 are the same height as color filters 200, 204 and 206, they prevent pixel crosstalk by reflecting filtered light down and into the intended photosensitive region of pixel circuitry 304. As the arrows in FIG. 3 illustrate, reflective sidewalls 206 reflect light from either surface (e.g., the surface facing green light filter 202 or the surface facing red light filter 208). Reflective sidewalls 206 are about 100 nm thick (thickness can vary between 50 nm and 150 nm). While reflective sidewalls can vary in thickness, it is beneficial for the ratio between the height and the width to stay sufficiently high to allow proper control of the grid profile during manufacturing. Additionally, if the wall is too thick a large percentage of incident light is reflected from the top of each of reflective sidewalls 206 and lost. Assuming constant height, the thinner reflective sidewalls 206 are, the higher the QE of the corresponding pixel will be, as long as reflective sidewalls 206 are not made so thin as to be rendered transparent. Micro-lenses 314 are disposed above each of green, red and blue color filters 200, 204 and 206. Micro-lenses 314 refract incident light and direct it toward the center of the associated photodiode, thereby further increasing QE.

In the example embodiment, reflective sidewalls 206 are formed from tin nitride. In alternate embodiments, reflective sidewalls 206 can be formed from tungsten, aluminum, or other reflective material, assuming the material can be deposited in sufficiently thin layers. Additionally, reflective sidewalls can be formed from multiple layers, such as a dielectric layer and a metal layer. Alternatively, reflective sidewalls 206 can be sandwiched between two oxide layers. In such an embodiment, the second oxide layer would be deposited after reflective sidewalls 206 are formed. The second oxide layer can be thinner, because it does not need to function as an etch stop layer. The second oxide layer provides increased protection for image sensor 100.

Figure 4A:
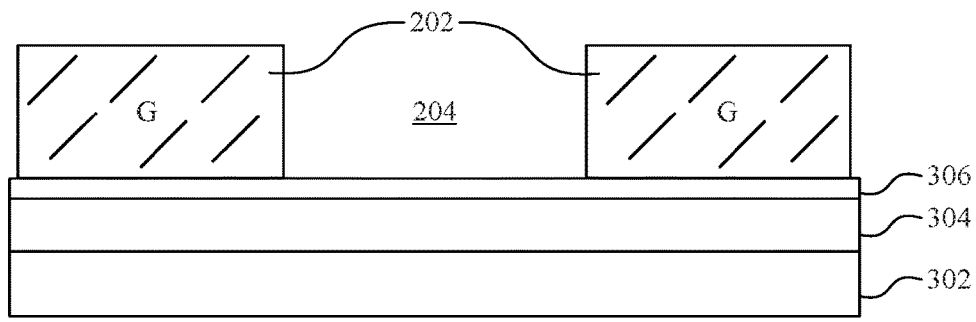
FIGS. 4A-4F are cross sectional views of the image sensor of FIG. 1, taken along line A-A, at various times throughout the manufacturing process.

FIGS. 4A-4F illustrate an example process for forming color filters on an image sensor. FIG. 4A shows portion 300, including substrate 302, pixel circuitry 304, oxide layer 306, and green color filters 202. As explained above, green color filters 202 are formed using known processes.

Figure 4B:
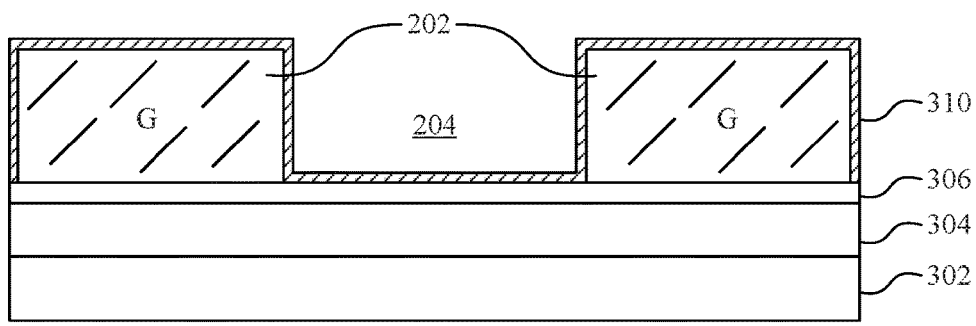

FIG. 4B shows portion 300 after etch-resistant layer 310 has been formed on the top and side surfaces of green color filters 200 and on oxide layer 306 in one of gaps 204. In the example embodiment, etch-resistant layer 310 is a silicon oxide layer (e.g., silicon dioxide $SiO_2$) formed by a low temperature (~200 C) chemical vapor deposition (CVD), with a thickness of approximately 10 nm. The thickness of etch-resistant layer can be varied as long as the layer remains transparent to the relevant wavelengths of light. In alternate embodiments, etch-resistant layer 310 can be formed by any of a number of processes, including, but not limited to, CVD, physical vapor deposition (PVD), etc.

Figure 4C:
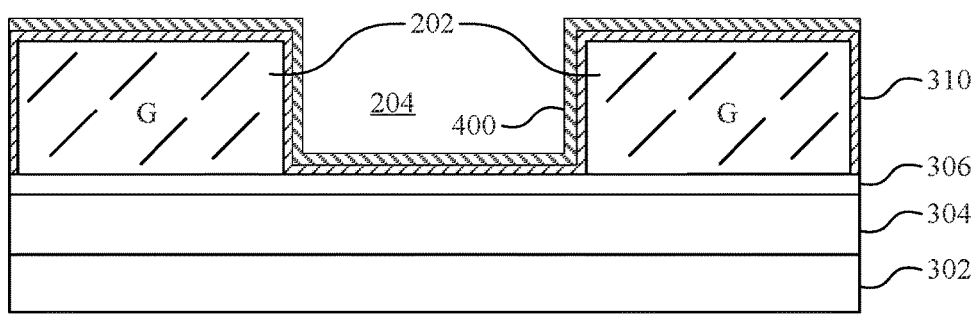

FIG. 4C shows portion 300 after a reflective layer 400 has been formed over etch-resistant layer 310. In the example embodiment, reflective layer 400 is a metal layer (e.g., W, TiN, etc.) formed by PVD. In alternate embodiments, reflective layer 400 can be formed by other known, suitable processes.

Figure 4D:
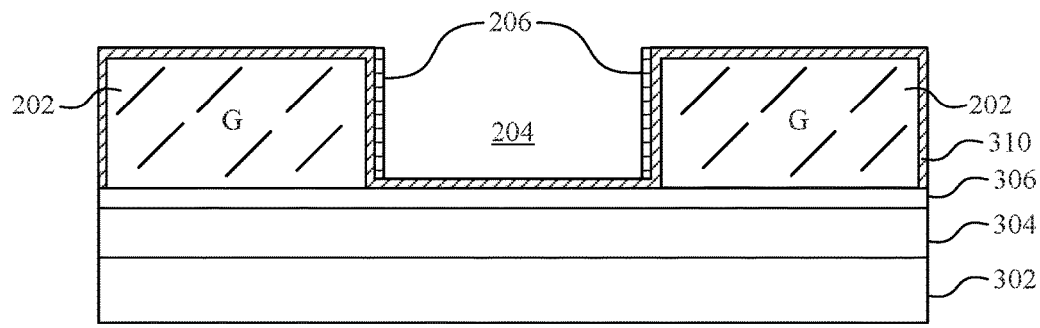

FIG. 4D shows portion 300 after most of reflective layer 400 has been removed by an anisotropic dry etch directed from top to bottom. Because the ratio between the height of reflective sidewalls and the thickness of reflective layer 400 is large, the anisotropic etch leaves reflective sidewalls 206 in place, but removes reflective layer 400 from the top surfaces of green color filters 200 and the portion of etch-resistant layer 310 in the bottom of gap 204. Reflective layer 400 can be removed by any of a number of known, suitable processes, including, but not limited to, dry etching, wet etching, and so on.

Figure 4E:
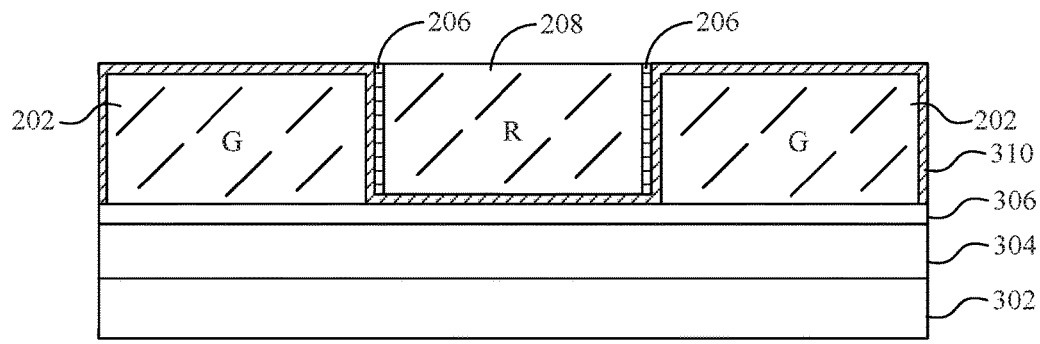

FIG. 4E shows portion 300 after a red color filter 208 has been formed into gap 204. In a similar but separate step, which is not illustrated in FIG. 4E, blue color filters 210 are formed in a remaining group of gaps 204, which do not contain a green color filter 202 or a red color filter 208.

Figure 4F:
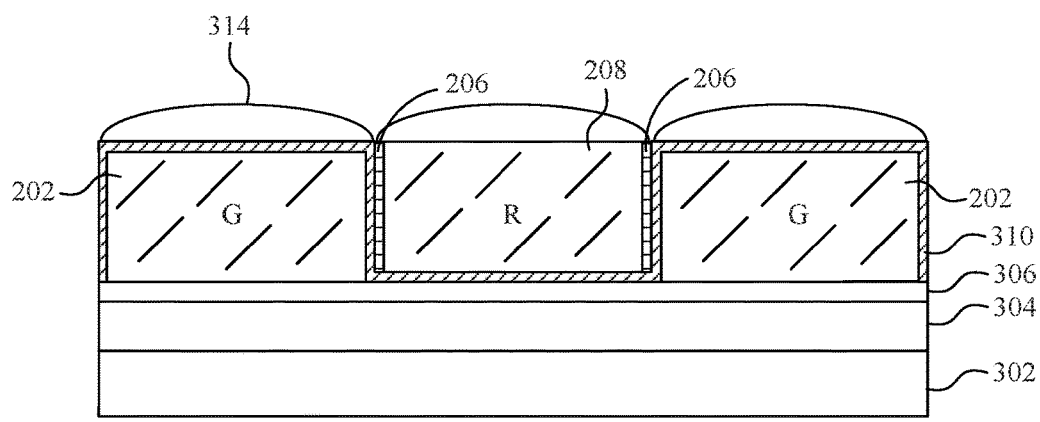

FIG. 4F shows portion 300 after micro-lenses 314 have been formed on top of green color filters 200 and red color filter 204.

Figure 5:
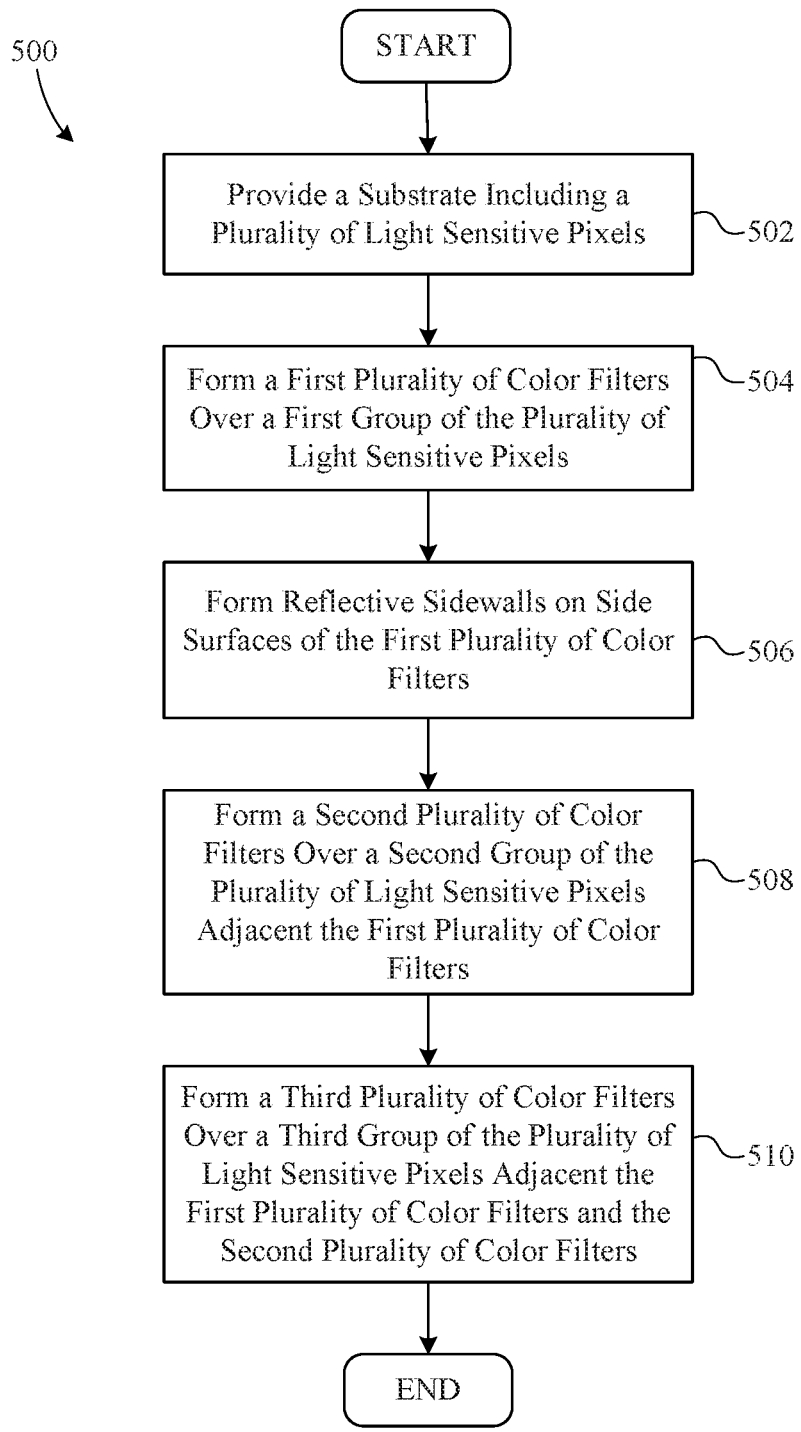
FIG. 5 is a flow chart illustrating an example method of manufacturing the image sensor of FIG. 1

FIG. 5 is a flow chart summarizing an example method 500 of manufacturing an image sensor. In a first step 502, a substrate including a plurality of light sensitive pixels is provided. Then, in a second step 504, a first plurality of color filters is formed over a first group of the plurality of light sensitive pixels. Then, in a third step 506, reflective sidewalls are formed on side surface of the color filters of the first plurality of color filters. Next, in a fourth step 508, a second plurality of color filters is formed over a second group of the plurality of light sensitive pixels, adjacent the first plurality of color filters. Then, in a fifth step 510, a third plurality of color filters over a third group of the plurality of light sensitive pixels, adjacent the first plurality of color filters and the second plurality of color filters.

Figure 6:
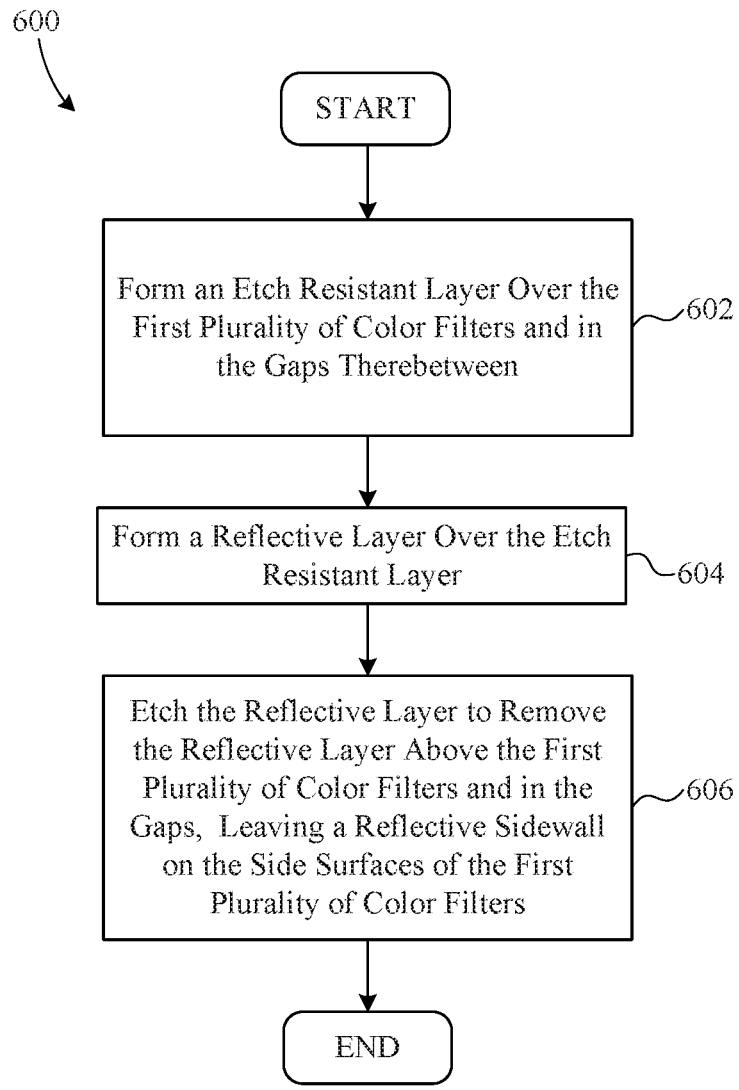
FIG. 6 is a flowchart summarizing an example method of performing a third step (forming reflective side walls) of the method of FIG. 5.

FIG. 6 is a flowchart summarizing an example method 600 of performing third step 506 (forming reflective side walls) of method 500 of FIG. 5. In a first step 602, an etch-resistant layer is formed over the first plurality of color filters and in the gaps therebetween. Next, in a second step 604, a reflective layer is formed on the etch-resistant layer. Then, in a third step 606, the reflective layer is etched to remove the reflective layer above the first plurality of color filters and in the gaps, leaving a reflective sidewall on the side surfaces of the first plurality of color filters.

The description of particular embodiments of the present invention is now complete. Many of the described features may be substituted, altered or omitted without departing from the scope of the invention. For example, alternate color schemes (e.g. Yellow-Magenta-Cyan) can be used in place of the RGB scheme described. As another example, the present invention can be utilized to eliminate pixel crosstalk in image sensors with alternate pixel shapes (e.g. hexagonal) and/or structures. These and other deviations from the particular embodiments shown will be apparent to those skilled in the art, particularly in view of the foregoing disclosure.

We claim:

1. A method of manufacturing an image sensor, said method comprising:
   providing a substrate including a plurality of light sensitive pixels;
   forming a first plurality of color filters over a first group of said plurality of light sensitive pixels;
   forming reflective side walls on side surfaces of said color filters of said first plurality of color filters; and
   forming a second plurality of color filters over a second group of said plurality of light sensitive pixels, such that each filter of said second plurality of color filters is separated from each adjacent filter of said first plurality of color filters by one of said reflective sidewalls; and
   wherein
   said step of forming said reflective sidewalls includes
      forming an etch-resistant layer over said first plurality of color filters and in gaps therebetween,
      forming a reflective layer over said etch-resistant layer, and
      etching said reflective layer to remove said reflective layer from above said first plurality of color filters and from bottoms of said gaps, leaving a portion of said reflective layer on said side surfaces of said color filters of said first plurality of color filters.

2. The method of claim 1, wherein said step of forming an etch-resistant layer over said first plurality of color filters and in said gaps includes forming an etch-resistant layer that is less than 12 nm thick and greater than 8 nm thick.

3. The method of claim 2, wherein said step of forming a reflective layer over said etch-resistant layer includes forming a reflective layer that is less than 150 nm thick and greater than 50 nm thick.

4. The method of claim 1, wherein:
   said etch-resistant layer includes a dielectric material; and
   said reflective layer includes a metal layer.

5. The method of claim 4, wherein:
   said metal layer includes tin nitride; and
   said dielectric material includes silicon dioxide.

6. The method of claim 4, wherein:
   said metal layer includes tungsten; and
   said dielectric material includes silicon dioxide.

7. The method of claim 4, wherein:
   said metal layer includes aluminum; and
   said dielectric material includes silicon dioxide.

8. The method of claim 1, wherein said step of forming an etch-resistant layer over said first plurality of color filters and in said gaps includes forming said etch-resistant layer at a temperature cooler than 225 degrees Celsius.

9. The method of claim 8, wherein said step of forming said etch-resistant layer at a temperature cooler than 225 degrees Celsius includes forming said etch-resistant layer using a chemical vapor deposition process.

10. The method of claim 8, wherein said step of forming said etch-resistant layer at a temperature cooler than 225 degrees Celsius includes forming said etch-resistant layer using a physical vapor deposition process.

11. The method of claim 1, wherein said step of forming a first plurality of color filters over said first group of said light sensitive pixels includes forming said first plurality of color filters from a material operative to pass light of a first predetermined color band.

12. The method of claim 11, wherein said step of forming said second plurality of color filters includes forming said second plurality of color filters from a material operative to pass light of a second predetermined color band different from said first predetermined color band.

13. The method of claim 12, further comprising:
forming a third plurality of color filters over a third group of said plurality of light sensitive pixels, such that each filter of said third plurality of color filters is separated from each adjacent filter of said first plurality of color filters by one of said reflective sidewalls; and wherein
said step of forming said third plurality of color filters includes forming said third plurality of color filters from a material operative to pass light of a third predetermined color band different from said first predetermined color band and said second predetermined color band.

14. The method of claim 1, wherein said step of forming reflective sidewalls on said side surfaces of said color filters of said first plurality of color filters includes forming said reflective sidewalls to extend at least as high as a top surface of one of said color filters of said first plurality of color filters.

\* \* \* \* \*